United States Patent [19]
Asai et al.

[11] Patent Number: 5,365,875
[45] Date of Patent: Nov. 22, 1994

[54] SEMICONDUCTOR ELEMENT MANUFACTURING METHOD

[75] Inventors: Ichirou Asai; Noriji Kato; Mario Fuse, all of Kanagawa, Japan

[73] Assignee: Fuji Xerox Co., Ltd., Tokyo, Japan

[21] Appl. No.: 946,645

[22] Filed: Sep. 18, 1992

[30] Foreign Application Priority Data

Mar. 25, 1991 [JP] Japan ................................. 3-84661
Jan. 14, 1992 [JP] Japan ................................. 4-023341

[51] Int. Cl.$^5$ ............................................. C30B 1/06
[52] U.S. Cl. ...................................... 117/7; 117/10; 437/84; 437/108
[58] Field of Search .................. 437/84, 109, 233; 156/603

[56] References Cited

U.S. PATENT DOCUMENTS

| | | | |
|---|---|---|---|
| 4,234,358 | 11/1980 | Celler et al. | 156/DIG. 93 |
| 4,358,326 | 11/1982 | Doo | 437/109 |
| 4,417,347 | 11/1983 | Muka et al. | 437/934 |
| 4,439,245 | 3/1984 | Wu | 437/19 |
| 4,693,758 | 9/1987 | Kobayashi et al. | 437/56 |
| 5,122,223 | 6/1992 | Geis et al. | 156/603 |

OTHER PUBLICATIONS

"High–Performance TFT's Fabricated by XeCl Excimer Laser Annealing . . . "; IEEE Transactions on Electron Devices, vol. 36, No. 12, Dec. 1989.
"Englargement of P–Si film Grain Size by Excimer . . . " Extended Abstracts of the 1991 Int'l Conf. on Solid State Devices & Materials, 1991, pp. 623–625.
Extended Abstracts (The 38th Spring Meeting, 1991); The Japan Society of Applied Physics and Related Societies No. 2.
Sameshima et al, (I) "XeCl Excimer Laser Annealing Used to Fabricate Poly–SI TFTS", Mat, Res. Soc. Symp Pro. Vol. 71 Apr. 1986 pp. 435–440.
Sameshima et al, (II) "XeCl Excimer Laser Annealing Used to Fabricate Poly–SI TFTS " Jap. Jour. Applied Physics vol. 28, No. 10 Oct. 1989 pp. 1789–1793.

*Primary Examiner*—Robert Kunemund
*Attorney, Agent, or Firm*—Finnegan, Henderson, Farabow, Garrett & Dunner

[57] ABSTRACT

An object of this invention is to provide a semiconductor element manufacturing method in which, in forming a polycrystal semiconductor layer by applying ultraviolet rays to an amorphous semiconductor layer formed on a large substrate, an excimer laser employed in the conventional art is used in such a manner that the layer is made uniform in crystallinity, thereby to manufacture a polycrystal semiconductor layer high in quality. According to the present invention, in a semiconductor element manufacturing method comprising a step of applying an excimer laser beam providing a beam spot having a predetermined irradiation area to an amorphous semiconductor layer formed on an insulating substrate to crystallize the amorphous semiconductor layer to obtain a polycrystal semiconductor layer, the beam spot is moved over said amorphous semiconductor layer in a scanning mode while being shifted with a pitch of at most 1 mm, so that all the parts of the semiconductor layer are substantially equal to one another in the energy applied thereto.

4 Claims, 8 Drawing Sheets

ANNEALING DIRECTION

ANNEALING DIRECTION

SEMICONDUCTOR ELEMENT MANUFACTURING METHOD

BACKGROUND OF THE INVENTION

This invention relates to a method of manufacturing a semiconductor element which is formed by a thin film process, and more particularly to a method of applying ultraviolet rays in the case where an amorphous semiconductor layer formed on a large substrate is annealed by applying ultraviolet rays to it, to form a polycrystal semiconductor layer.

Recently, there has been a strong demand for provision of a liquid crystal panel which is large in size and high in resolution, or a contact type image sensor which is high in operating speed and high in resolution. In order to meet this requirement, it is essential to uniformly form thin film transistors (TFT) on a large insulating substrate which are high in performance.

The thin film transistor is formed for instance as follows: A polycrystal semiconductor layer is formed on a glass substrate which is low in strain temperature and low in manufacturing cost and can be made large in area with ease. In the polycrystal semiconductor layer thus formed, a semiconductor active region forming a channel is formed, and in addition a source electrode, a drain electrode, and a gate electrode are formed which are low in resistance. In the case where a glass substrate is employed which is low in strain temperature, it is necessary to protect the glass substrate from thermal damage. Hence, the polycrystal semiconductor layer is formed as follows: That is, an amorphous silicon (a-Si) layer is formed on the glass substrate, and is then annealed with the output ultraviolet rays of an excimer laser, to form a polycrystal silicon (poly-Si) layer. With the aid of a beam homogenizer or the like, the output ultraviolet rays of the excimer laser can be formed into a beam which provides a beam spot of about 10 mm square on the glass substrate. The beam spot is smaller than the glass substrate. Therefore, the beam spot is applied to the glass substrate in a scanning mode several times while being shifted in position, to anneal the amorphous semiconductor layer formed large on the glass substrate. In this case, the laser beam is applied to the amorphous semiconductor layer in such a manner that the peripheries of the beam spots are overlapped with one another as indicated at L in FIGS. 4 or 5. This is to eliminate the difficulty that the amorphous semiconductor layer is not completely irradiated with the laser beam, and to eliminate the difficulty that the amorphous semiconductor layer is insufficiently annealed because the energy of irradiation is abruptly decreased at the periphery of the beam spot, The above-described conventional method is disadvantageous in the following points: It is difficult to make the sum of energy provided by the overlapped portions of the beam spots equal to that provided by the remaining portions. Hence, at the overlapped portions of the beam spots, the film stress may be increased, or the surface flatness may be decreased. That is, it is impossible to form a polycrystal semiconductor layer high in quality according to the conventional method.

Even if the laser beam is processed and shaped with a beam homogenizer or the like, the intensity of energy in the beam is fluctuated in distribution of the order of several percent as shown in FIG. 5, which also makes it difficult to uniformly irradiate the semiconductor layer with the laser beam so as to allow all the parts of the amorphous semiconductor layer to receive the same amount of energy.

SUMMARY OF THE INVENTION

In view of the foregoing, an object of this invention is to provide a semiconductor element manufacturing method in which, in forming a polycrystal semiconductor layer by applying ultraviolet rays to an amorphous semiconductor layer formed on a large substrate, with an excimer laser employed in the prior art, the semiconductor layer is made uniform in crystallinity, thereby to manufacture a polycrystal semiconductor layer high in quality.

The foregoing object of the invention has been achieved by the provision of a semiconductor element manufacturing method comprising a step of applying an excimer laser beam providing a beam spot having a predetermined irradiation area to an amorphous semiconductor layer formed on an insulating substrate to crystallize the amorphous semiconductor layer to obtain a polycrystal semiconductor layer; in which the beam spot is moved over the amorphous semiconductor layer in a scanning mode while being shifted with a pitch of at most 1 mm.

Further, the foregoing object of the invention has been achieved by the provision of a semiconductor element manufacturing method comprising steps of: a first irradiation step of applying an excimer laser beam the intensity of energy of which is larger than a threshold value for crystallization; and a second irradiation step of applying an excimer laser beam the intensity of energy of which is larger than in the first irradiation step.

According to the present invention, the beam spot is moved over the amorphous semiconductor layer in a scanning mode while being shifted with a pitch of at most 1 mm. Therefore, all the parts of the amorphous semiconductor layer thus scanned are substantially equal to one another in the energy applied thereto, thus being uniform in crystallinity.

According to the present invention, the amorphous semiconductor layer is crystallized with a laser beam of low energy, so that the resultant polycrystal semiconductor film is flat although including a number of defects. In addition, a laser beam of high energy is applied to it, so that the defects are molten away from the polycrystal semiconductor film while the latter is maintained unchanged in flatness. Thus, the crystallinity is further improved.

BRIEF DESCRIPTION OF THE DRAWING(S)

FIG. 1 is an explanatory diagram for a description of an annealing operation which is achieved by performing a small pitch scanning operation with a beam spot in one example of a semiconductor element manufacturing method according to this invention.

FIGS. 2 (a) through (d) are sectional views showing steps of manufacturing a thin film transistor according to the method of the invention.

FIGS. 6 (a) through (f) are sectional views showing steps of manufacturing a polycrystal silicon thin film transistor according to the conventional method.

FIGS. 7 (a) through (g) are sectional views showing steps of manufacturing a polycrystal silicon thin film transistor according to the method of the invention.

Figure 8:
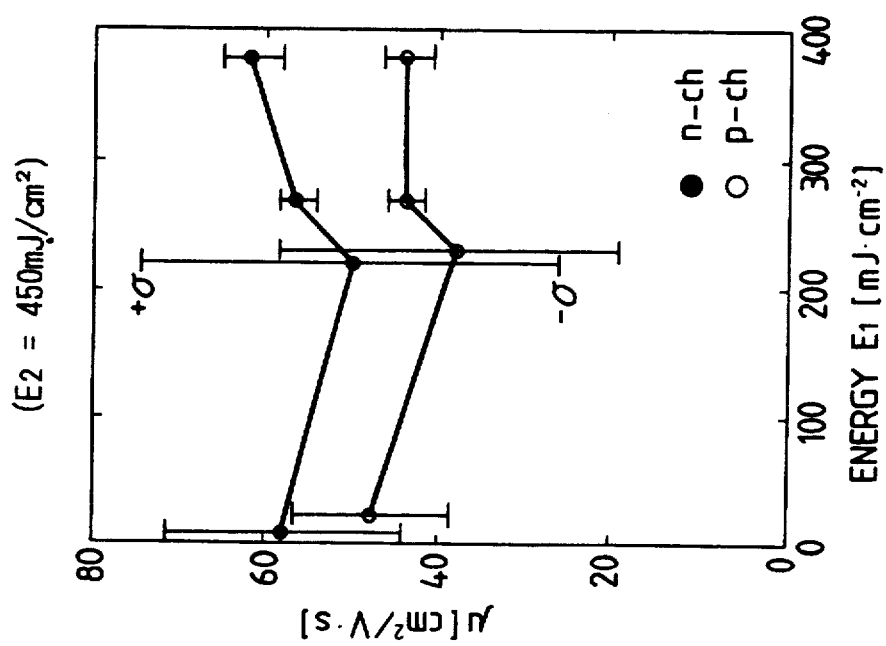

FIG. 8 is a graphical representation indicating the dependability of mobility $\mu$ on energy $E_1$ in the invention.

Figure 9:
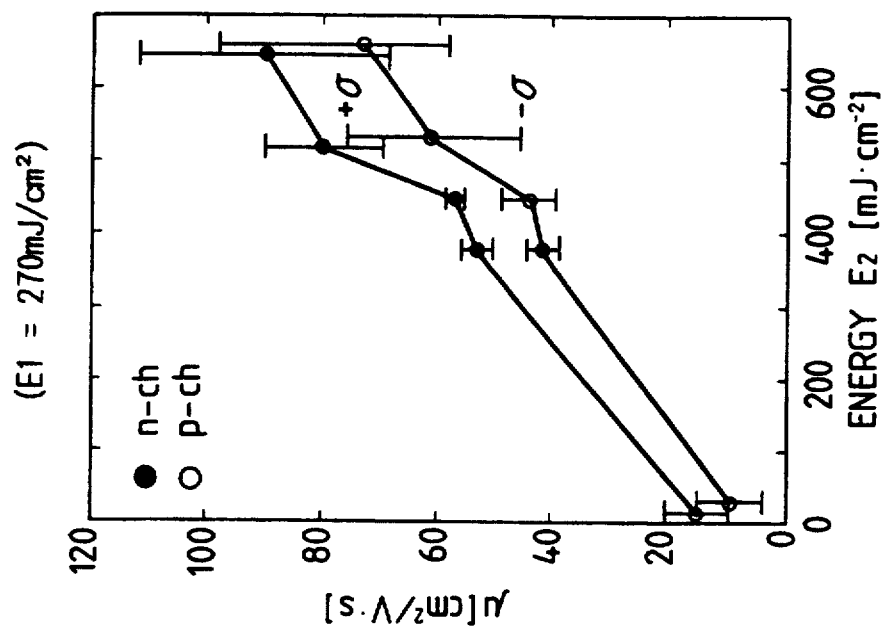

FIG. 9 is a graphical representation indicating the dependability of mobility $\mu$ on energy $E_2$ in the invention.

Figure 10:
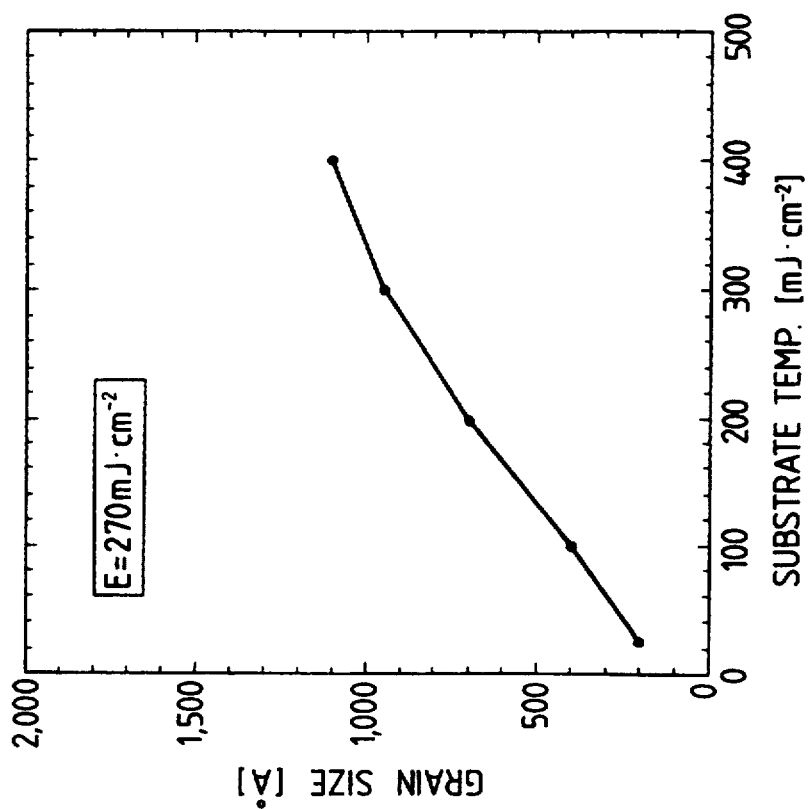

FIG. 10 is a graphical representation indicating grain size with substrate temperature in the invention.

Figure 11:
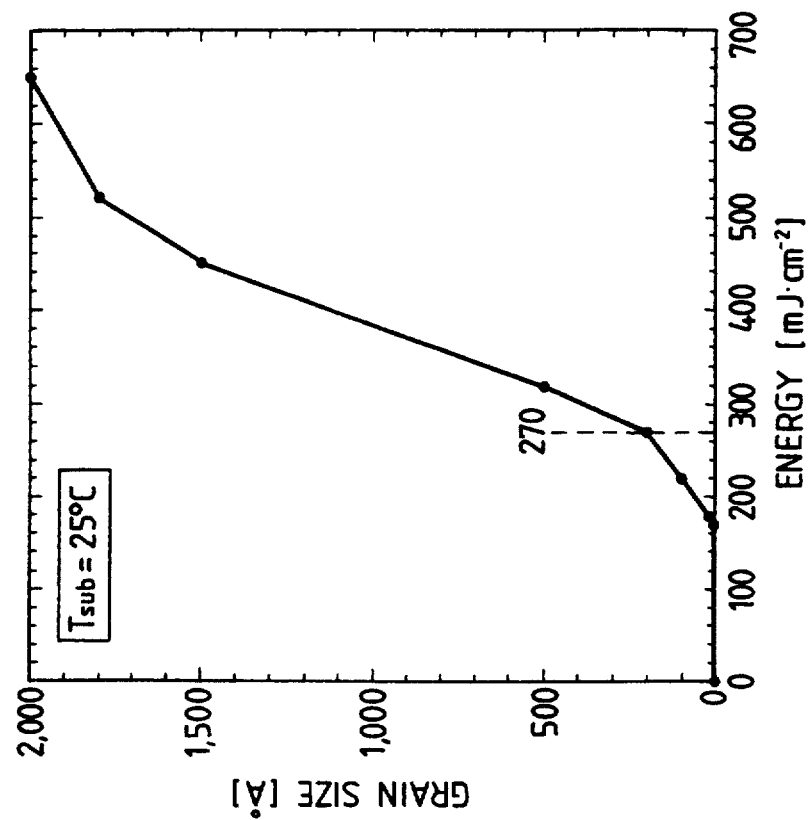

FIG. 11 is a graphical representation indicating grain size with laser energy in the invention.

Figure 12:
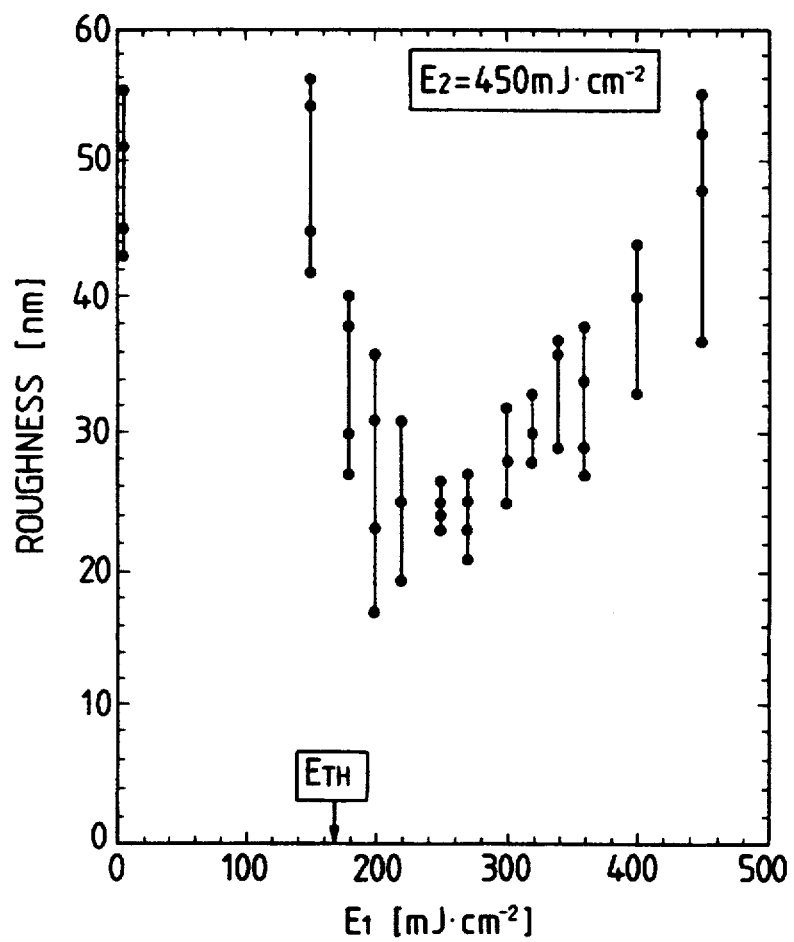

FIG. 12 is a graphical representation indicating relationships between surface roughness and energy $E_1$, with energy $E_2$ maintained unchanged, in the invention.

DETAILED DESCRIPTION OF THE PREFERRED EMBODIMENTS

An n-type thin film transistor manufacturing method, which constitutes a first embodiment of the invention, will be described with reference to the parts (a) through (d) of FIG. 2. In a large liquid crystal panel, or a contact type image sensor, a plurality of thin film transistors are formed, as active elements, on an insulating substrate.

A glass substrate 1 is employed as an insulating substrate. According to a LPCVD method, an amorphous silicon (a-Si) film 2 is formed on the surface of the glass substrate 1 set on a stage (not shown) to a thickness of 1000 Å at a film deposition temperature of 500° C. (the part (a) of FIG. 2). The amorphous silicon film 2 thus formed is annealed by application of ultraviolet rays from an excimer laser (KrF 248 nm, 10 Hz) to form a polycrystal silicon (poly-Si) layer 2' (the part (b) of FIG. 2). The amorphous silicon film 2 may be formed by sputtering or PECVD. With the aid of a beam homogenizer (not shown), the excimer laser provides a beam spot about 10×10 mm² in irradiation area, and the distribution of energy in the beam spot can be made ±5% or less in uniformity.

Figure 1:
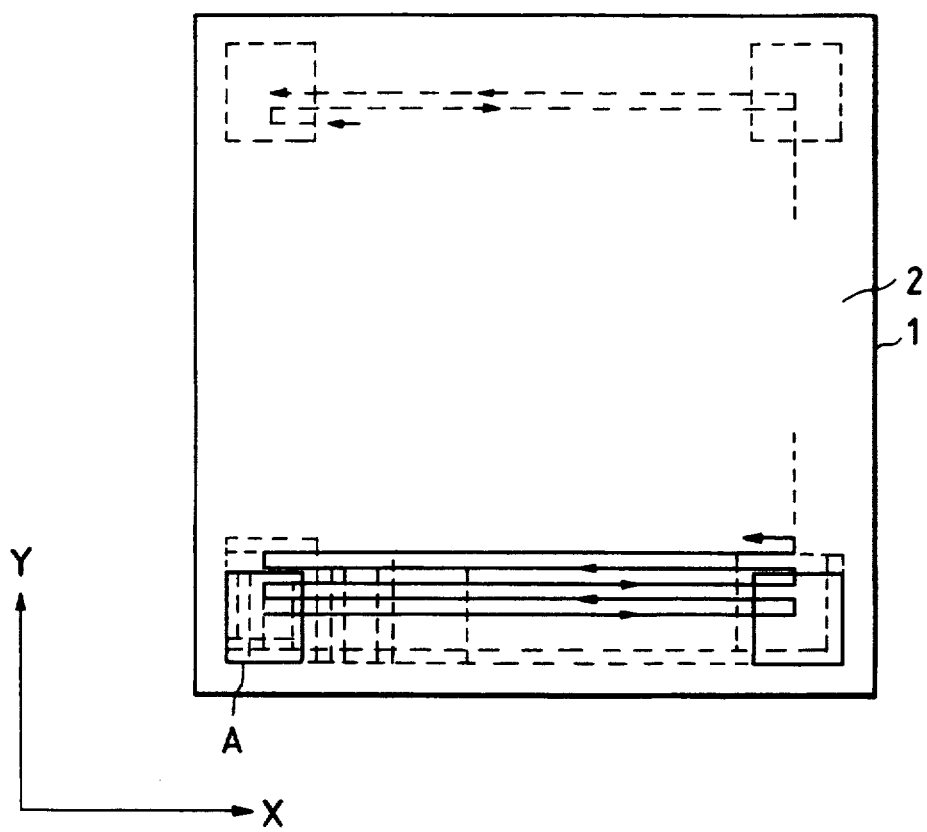
Figure 3:
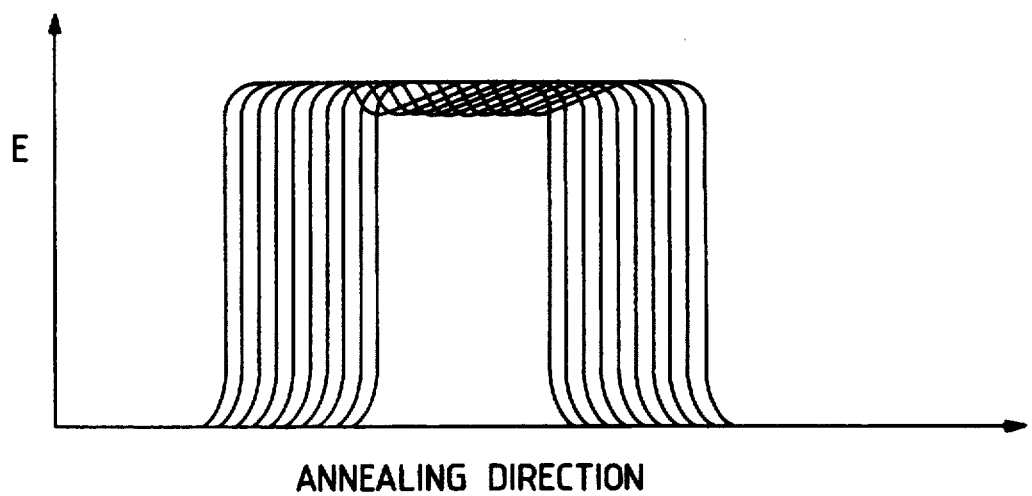
FIG. 3 is a graphical representation showing the distribution of energy in a beam spot used in the small pitch scanning operation according to the method of the invention.
Figure 2A:
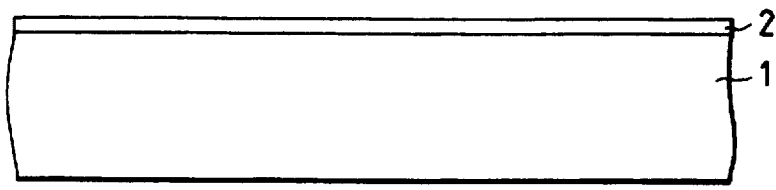
Figure 2B:
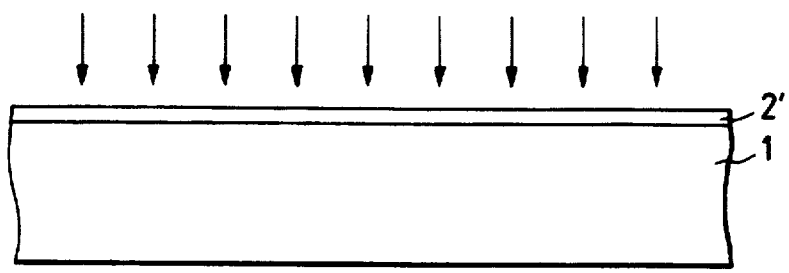
Figure 2C:
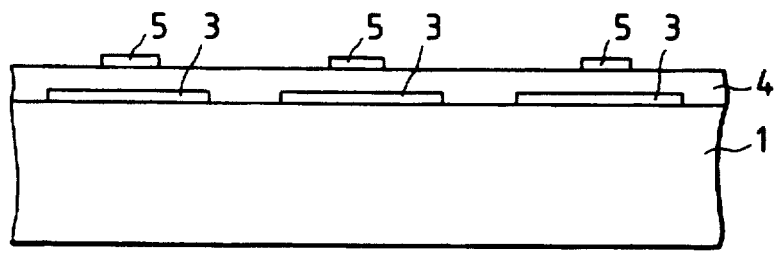
Figure 2D:
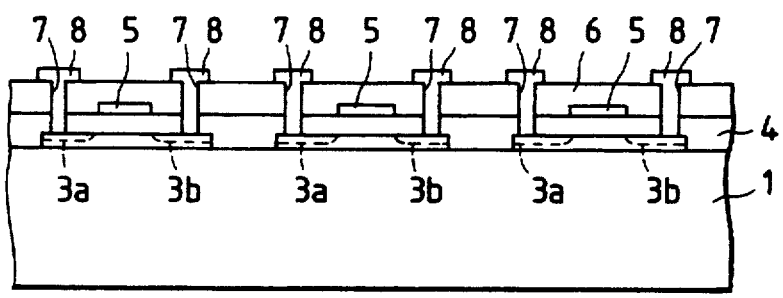

In an annealing operation, the excimer laser and the stage are moved relative to each other. That is, as shown in FIG. 1, the surface of the amorphous silicon film 2 formed on the glass substrate 1 is scanned, in its entirety, with the beam spot which is intermittently shifted with a pitch of 0.5 mm. This will be described in more detail. First, the beam spot having an irradiation area A is positioned at the lower left corner of the glass substrate 1, and is then intermittently moved to the right (in the direction of the arrow X) with a pitch of 0.5 mm. Upon arrival to the right end, the beam spot is shifted 0.5 mm upwardly (in the direction of the arrow Y), and is then intermittently moved to the left with a pitch of 0.5 mm. When the beam spot has reached the left end, it is shifted 0.5 mm upwardly (in the direction of the arrow Y), and is then intermittently moved to the right in the same manner. The above-described operations are repeatedly carried out until the surface of the amorphous silicon film 2 is scanned, in its entirety, with the beam spot having the irradiation area A.

The annealing operation is accomplished by scanning the surface of the amorphous silicon layer 2 with the beam spot twice (hereinafter referred to as "a step annealing operation", when applicable). That is, in the first irradiation of the amorphous silicon layer with the laser spot, the intensity of energy is larger than a threshold value for crystallization; and in the second irradiation, the intensity of energy is larger than that in the first irradiation. In a concrete example of the manufacturing method, the threshold value was 170 mJ/cm², and therefore, in the first irradiation, the intensity of energy was set to 270 mJ/cm², and in the second irradiation, it was set to 450 mJ/cm².

Next, the polycrystal silicon layer 2' is patterned to form islands 3 respectively for thin film transistors. Under this condition, a silicon oxide ($SiO_2$) film is formed over them to a thickness of 1000 Å by LPCVD; that is, a gate insulating film 4 is formed. In addition, a polycrystal silicon (poly-Si) film is formed by PCVD, and is patterned by photolithography to form gate electrodes 5 (the part (c) of FIG. 2).

Next, phosphor is implanted into the islands 3 and the gate electrodes 5 by ion implantation, to form a source region 3a and a drain region 3b in each island. Thereafter, a silicon oxide ($SiO_2$) film is deposited to a thickness of 7000 Å by LPCVD; that is, an inter-layer insulating film 6 is formed. After the implanted phosphor is activated, contact holes 7 are formed in the gate insulating film 4 and the inter-layer insulating film 6 in correspondence to the source regions 3a and the drain regions 3b. An aluminum (Al) film is formed and patterned to provide lead wires 8 (the part (d) of FIG. 2).

In a second embodiment of the invention, unlike the first embodiment, the step annealing operation is not carried out. That is, in the second embodiment, thin film transistors are formed by performing a so-called "single annealing operation". That is, the amorphous silicon layer is scanned with a beam spot having an intensity of energy of 450 mJ/cm² only once. The other manufacturing steps are the same as those in the above-described first embodiment.

In each of the above-described embodiments, the beam spot provided by the excimer laser scans the amorphous silicon layer with a pitch of 0.5 mm; that is, the beam spot is moved with a considerably small pitch. Therefore, even if the distribution of energy in the beam spot is not uniform, all the parts of the amorphous silicon layer are equal to one another in the total amount of energy applied thereto by irradiation of the beam; that is, the amorphous silicon layer thus scanned is uniform in crystallinity.

Figure 5:
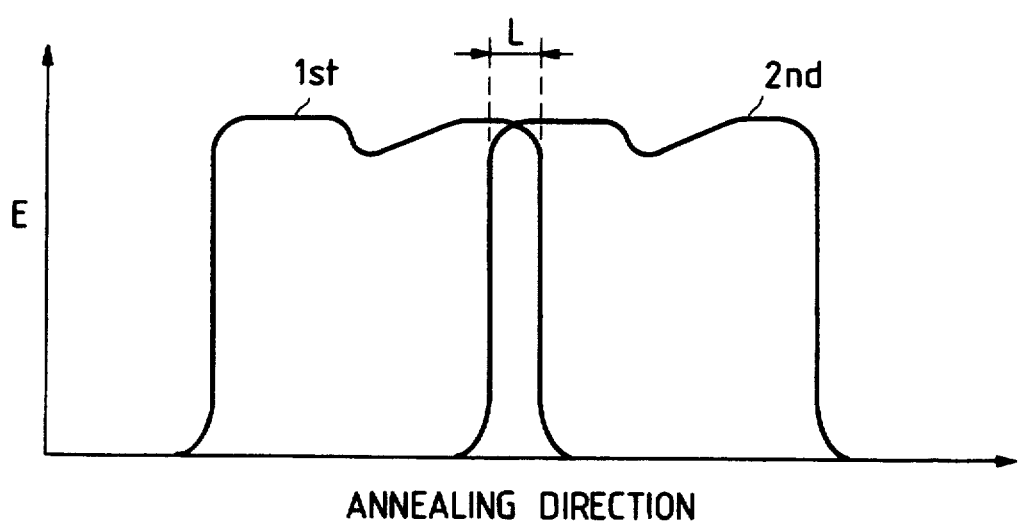
FIG. 5 is a graphical representation showing the distribution of energy in the beam spot employed in the conventional method.
Figure 6A:
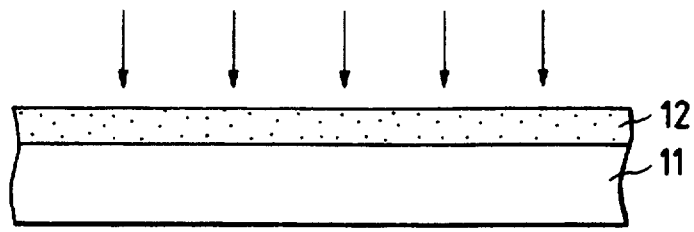
Figure 6B:
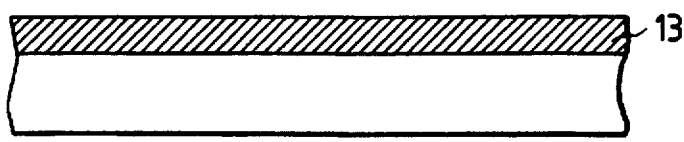
Figure 6C:
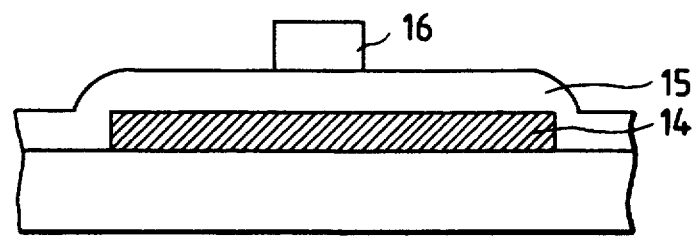
Figure 6D:
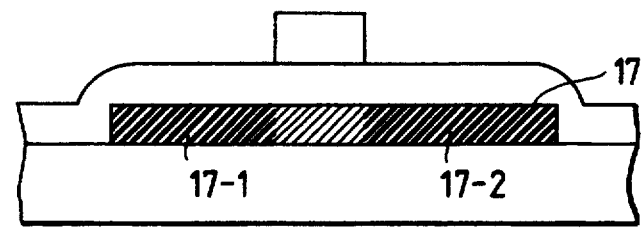
Figure 6E:
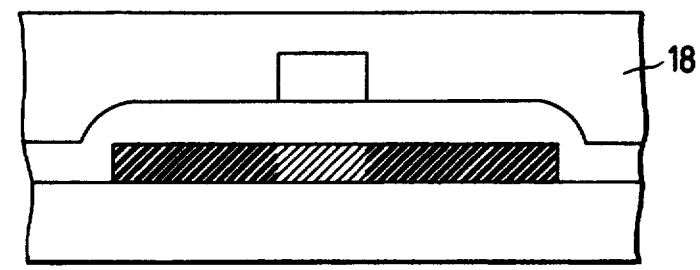
Figure 6F:
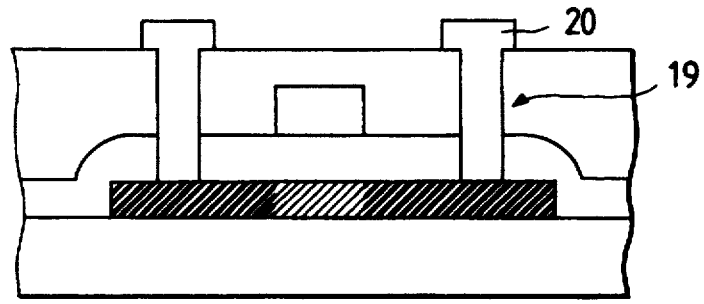
Figure 7A:
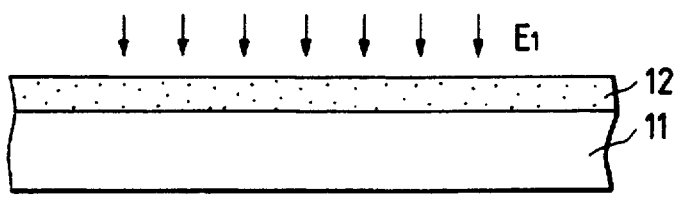
Figure 7B:
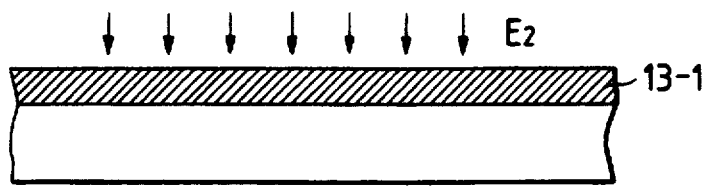
Figure 7C:
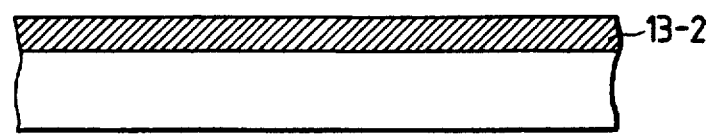
Figure 7D:
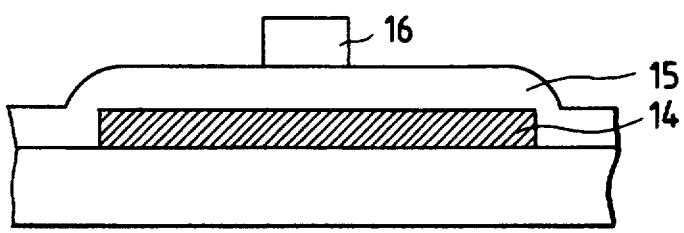
Figure 7E:
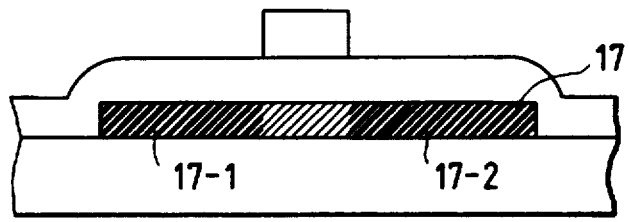
Figure 7F:
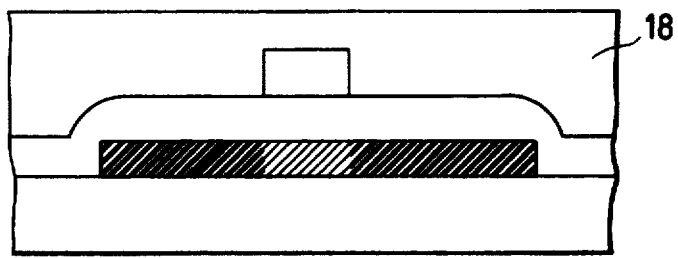
Figure 7G:
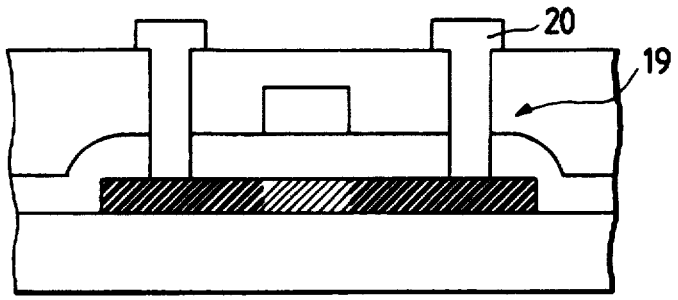

On the other hand, in the conventional method in which the beam spot is shifted in such a manner that the peripheral portions of the beam spots are overlapped with one another, it is difficult to make the region where the peripheral portions of the beam spots are overlapped equal to the remaining region in the total amount of energy applied thereto. In addition, the non-uniformity in the distribution of energy in the beam spot results in the non-uniformity in crystallinity of the amorphous silicon layer (cf. FIG. 5).

At the edge of the beam spot, the intensity of energy is abruptly decreased. The width is about 200 $\mu$m. However, in the embodiment, the beam spot provided by the excimer laser is moved with a small pitch (hereinafter referred to as "a small pitch scanning operation", when applicable), and therefore the temperature of the part of the amorphous silicon layer (which is to be irradiated next) adjacent to the front end of the beam spot (hereinafter referred to as "an adjacent part", when applicable)

has been increased by the annealed part of the amorphous silicon layer. Hence, when the adjacent part of the amorphous silicon layer is annealed, the cooling speed is lowered as much as the temperature rise, and therefore, in crystallization, the resultant grain size is large, and excellent in quality. In this connection, it has been found through experiments that, in order to increase the temperature of the adjacent part to be irradiated next to a suitable value, the scanning pitch M should be set to 0.5 mm or less.

As the part of the amorphous silicon layer adjacent to the annealed part of the latter is increased in temperature rise, because of the reduction of the cooling speed described above the crystallization is effected moderately, and therefore the film stress to the resultant polycrystal silicon film is reduced as much. Hence, the small pitch scanning operation with the beam spot provided by the excimer laser improves the crystallinity, and reduces the film stress, thus making the crystallinity uniform.

The effects of the above-described embodiments will be described by using concrete numerical data.

Figure 4:
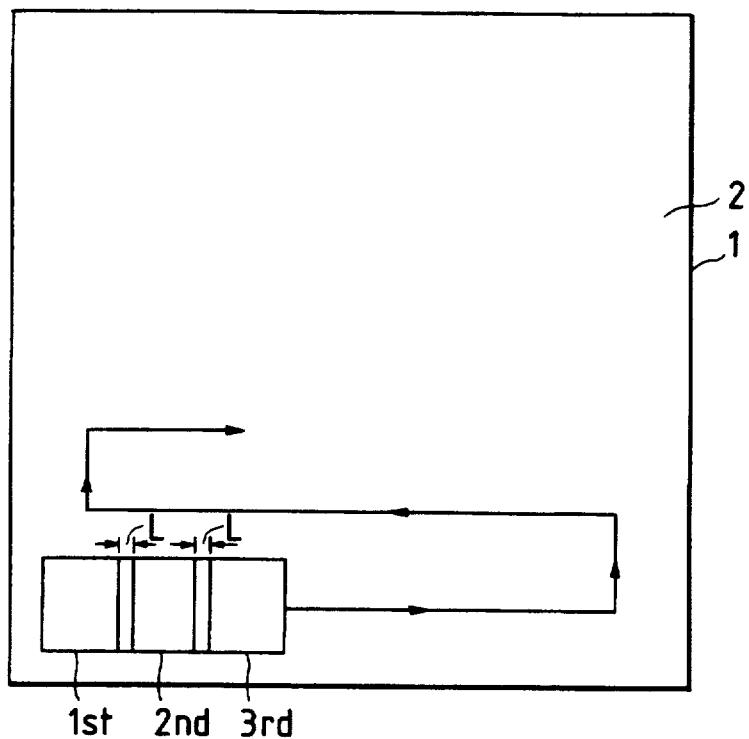
FIG. 4 is an explanatory diagram for a description of an annealing operation using a beam spot according to a conventional semiconductor element manufacturing method.

With respect to the fluctuations in the mobility $\mu$, threshold voltage Vth and leak current Ileak of the thin film transistors in the glass substrates which are formed according to the first embodiment (in which the small pitch scanning operation, and the step annealing operation are carried out) and the second embodiment (in which the small pitch scanning operation, and the single annealing operation are carried out), characteristic uniformity $3\sigma/\text{ave}$ (where $\sigma$ is the standard deviation in distribution, and ave is the average value) is measured and indicated, as "dependability on irradiation", in Table 1. For the purpose of comparison, Table 1 indicates the characteristic uniformity of the mobility $\mu$, threshold voltage Vth, and leak current Ileak of the thin film transistor which is formed according to a manufacturing method in which, similarly as in the conventional method, the beam spots are overlapped by 0.5 mm (the width L in FIGS. 4 or 5), and the annealing operation is carried out with the beam spot having an intensity of energy of 450 mJ/cm$^2$ (no small pitch scanning operation is carried out, and the single annealing operation is carried out), and the characteristic uniformity of the mobility $\mu$, threshold voltage Vth, and leak current Ileak of the thin film transistor which is formed according to a manufacturing method in which the beam spots overlapping width L is set to 0.5 mm, and the first annealing operation is carried out with an intensity of energy of 270 mJ/cm$^2$ and the second annealing operation is carried out with an intensity of energy of 450 mJ/cm$^2$ (no small pitch scanning operation is carried out, and the step annealing operation is carried out).

TABLE 1

| Laser irradiation method | Characteristic uniformity (%) ($3\sigma/\text{ave}$) | | |
|---|---|---|---|
| | $\mu$ | Vth | Ileak |
| Step annealing, with small pitch scanning | 5 | 22 | 22 |
| Single annealing, with small pitch scanning | 20 | 15 | 52 |
| Step annealing, without small pitch scanning | 35 | 37 | 56 |
| Single annealing, without small pitch scanning | 81 | 38 | 118 |

As is seen from Table 1, both in the case where the step annealing operation is carried out and in the case where the single annealing operation is carried out, the thin film transistor formed by the method in which the annealing operation is carried out by shifting the beam spot with a pitch of 0.5 mm ("small pitch scanning operation") is higher in characteristic uniformity. In the case of the thin film transistor formed by the method in which the step annealing operation is carried out together with the small pitch scanning operation, when compared with the thin film transistor formed by the method in which the single annealing operation is carried out together with the small pitch scanning operation, the threshold voltage Vth is not so changed, but the mobility $\mu$ and the leak current Ileak are greatly changed. The thin film transistor formed by the method in which the step annealing operation is carried out together with the small pitch scanning operation is satisfactory in characteristic; that is, the mobility $\mu$ is 60 cm$^2$/V s, the threshold voltage Vth is 1.5 V or less, and the leak current Ileak is 0.1 pA/$\mu$m or less.

It is considered that improvement of the crystallinity by the step annealing operation is due to the following reason: In the first irradiation, the amorphous silicon layer is crystallized with a light beam of low energy, so that a flat polycrystal silicon layer is formed although it includes many defects. In order to remove the defects by melting, the second irradiation is carried out with a light beam of high energy. In this second irradiation, the edge heating effect at the periphery of the beam spot is decreased. That is, since the amorphous silicon layer is converted, in its entirety, into the polycrystal silicon layer which is ten times as high in thermal conduction than the former, it becomes relatively difficult to hold heat at the periphery of the beam spot, which eliminates the difficulty that at the periphery of the beam spot, the flatness is lowered or the film stress is increased.

In the annealing operation by the first irradiation with a light beam low in the intensity of energy, the flatness is high because the light beam used is low in the intensity of energy. In the annealing operation by the second irradiation with a light beam high in the intensity of energy, the flatness is not so greatly deteriorated, and the defects in the film can be molten away. Thus, in the case of the step annealing operation, compared with the single annealing operation, the flatness is high, and the crystallinity is further uniformized.

The grain size, and the flatness of the polycrystal silicon film formed according to the first embodiment (the step annealing is performed together with the small pitch scanning operation) were measured with a TEM and an AFM, respectively. The grain size was decreased to 0.08 $\mu$m, being normally 0.15 $\mu$m. But the flatness was 20% or less. The flatness was defined by a value which was obtained by dividing a half ($\frac{1}{2}$) of the difference between depression and projection (roughness) of the surface by the film thickness.

When, in the second irradiation in the first embodiment, the intensity of energy was increased from 450 mJ/cm$^2$ to 600 mJ/cm$^2$, the grain size was increased, but the flatness in the film was decreased, and the thin film transistors were increased in the fluctuation of characteristics. In order to increase the grain size as much as possible with the thin film transistors maintained satisfactory in characteristic, in the first embodiment the intensity of energy of the second irradiation should be set to a value with which the flatness is 20% of the film thickness or less.

In the above-described embodiments, the polycrystal silicon layer is formed for the semiconductor active layer of the thin film transistor. However, it should be noted that the technical concept of the invention may be applied to the case where it is required to form a polycrystal silicon film to provide gate electrodes, lead wires, etc.

Furthermore in the above-described embodiments, the polycrystal silicon layer is obtained by using the amorphous silicon layer. However, the technical concept of the invention may be applied to formation of other semiconductor films such as Ge and Si-Ge films.

A third embodiment of the invention will be concretely described while being compared with the conventional art. A process of formation of a polycrystal silicon TFT according to the invention is as shown in FIG. 7 (corresponding to FIG. 6 (the conventional art)).

First, an amorphous silicon film 12 was formed, as a semiconductor layer of a thin film transistor, on an insulating substrate 11 made of glass or the like. More specifically, the amorphous silicon film was formed on the substrate to a thickness of 1000 Å according to the LPCVD (low-pressure chemical vapor deposition) method in which the pressure in the reaction vessel was set to 300 mTorr, the substrate temperature was held at 500° C., the flow rate of a SiH$_4$ gas was set to 100 sccm, and the time of deposition was set to four hours. The density of hydrogen in the amorphous silicon film was 1 atomic percent or less.

The glass substrate was taken out, and a KrF excimer laser beam E$_1$ (with an oscillation wavelength λ of 248 nm) having an intensity of energy of 270 mJ/cm$^2$ was applied to the amorphous silicon film, to form a number of crystal silicon nuclei about 200 Å in crystal size in it. Thereafter, a KrF excimer laser beam E$_2$ (with an oscillation wavelength λ of 248 nm) having an intensity of energy 450 mJ/cm$^2$ larger than the intensity of energy provided at the growth of the crystal silicon nuclei was applied to remove the defects from outside and inside the crystal nuclei, thereby to obtain a polycrystal silicon film excellent in crystallinity. The beam spots of the two laser beams were set to 7×7 mm$^2$ with the aid of a beam homogenizer, and the pulse width was set to 20 nsec. In this case, the distribution of energy in each of the beams was at most ±5% in uniformity. The temperature of the substrate was fixedly set to 25° C.

The polycrystal silicon film was patterned to form an island corresponding to an operating layer 14, and a gate insulating film 15 of SiO$_2$ was formed to a thickness of 1000 Å by the LPCVD method. A polycrystal silicon layer was formed on the gate insulating film 15 to a thickness of 3000 Å by the same LPCVD method, and patterned to form a gate electrode 16. With the gate electrode 16 as a mask, dopants were implanted by an ion implantation method, to form a source electrode 17-1 and a drain electrode 17-2. An inter-layer insulating film 18 of SiO$_2$ was formed to a thickness of 7000 Å by the LPCVD method, and holes 19 were formed. Thereafter, hydrogen treatment was carried out at a temperature of 350° C., and an AlSiCu layer was formed and patterned, to form connecting leads 20. Thus, a thin film transistor was formed. More specifically, two kinds of thin film transistors—an n-channel thin film transistor, and a p-channel thin film transistor—were manufactured in the above-described manner. Dopants of phosphor (P) were employed for manufacture of the n-channel thin film transistor, and dopants of boron (B) were employed for manufacture of the p-channel thin film transistor.

The mobilities of the n-channel and p-channel thin film transistors thus manufactured were measured, and research was made on how the mobilities depended on the intensities of energy of the laser beams E$_1$ and E$_2$. The dependability on E$_1$ and that on E$_2$ are as indicated in FIG. 8 and FIG. 9, respectively.

Hereinafter, the intensity of energy of the laser beam E$_1$ will be represented by E$_1$, and the intensity of energy of the laser beam E$_2$ will be represented by E$_2$, when applicable.

As is seen from FIG. 8, with E$_1$=0 mJ/cm$^2$ corresponding to the conventional art (in which the laser beam E$_1$ was not applied), the thin film transistor is non-uniform in mobility. When E$_1$ is low, the mobility of the thin film transistor is not uniform. However, when E$_1$ exceeds about 270 mJ/cm$^2$, abruptly the mobility becomes uniform.

FIG. 9 shows relationships between the mobility and the intensity of energy E$_2$ which is changed, with E$_I$ fixedly set to 270 mJ/cm$^2$ (with which the mobility of the thin film transistor is most uniform). As E$_2$ increases, the non-uniformity of mobility is reduced; however, when E$_2$ exceeds about 460 mJ/cm$^2$, the mobility becomes gradually non-uniform, and when E$_2$ is 520 mJ/cm$^2$, the mobility is greatly lowered in uniformity. Because of this, in the embodiment, the most suitable values of E$_1$ and E$_2$ were 270 mJ/cm$^2$ and 450 mJ/cm$^2$, respectively. Under this condition, the thin film transistors with "(gate width)/(gate length)=50 μm/10 μm" were satisfactory in characteristic. That is, in the case of the n-channel thin film transistor, the mobility μ was 57 cm$^2$/V·s, the threshold voltage Vth was 0.8 V, and the minimum leak current Imin was 8 pA; whereas in the case of the p-channel thin film transistors, the mobility μ was 45 cm$^2$/V·s, the threshold voltage Vth was −2.7 V, and the minimum leak current Imin was −2 pA.

When the mobility was uniformized, the grain size of the polycrystal silicon film was measured under a transmission type electron microscope. As a result, it was found that the average grain size was about 50% of that provided by the conventional method in which irradiation is made with a single laser beam; however, in the layer, the distribution of grain size was uniform. Hence, it can be considered that, in the invention, the uniformization of mobility is due to the uniformization of grain size. The uniformization of grain size can be explained as follows: The value E$_1$ is larger than a threshold energy E$_{TH}$, but it is relatively small, and, when the film is annealed, a number of minute crystalline nuclei are formed in it. Each of the nuclei includes a number of defects which are substantially amorphous. When the energy E$_2$ (larger than E$_1$) is applied to the film in this state, the defects inside and outside the nuclei are removed by melting; however, the crystalline nuclei formed during application of the energy E$_1$ are not molten. Therefore, with the crystalline nuclei serving as rate-determining elements, the grain size is forcibly uniformly small. However, it should be noted that, if E$_2$ is excessively large, then the crystalline nuclei formed during application of the energy E$_1$ are also molten, similarly as in the case of the conventional method in which radiation is made with a single laser beam. This is because the low energy at the periphery of the laser beam, the non-uniformity in the distribution of energy of the laser beam, and the temperature gradient and fluctuation in the film act directly on the grain size during formation of the polycrystal silicon film. On the other hand, if E$_1$ is excessively small, then the crystalline nuclei of the polycrystal silicon layer formed in the amorphous silicon layer are extremely small, and they are removed readily when irradiated with the energy $E_2$. In order to maintain such small crystalline nuclei, the energy $E_2$ should be set to a smaller value. However, if the energy $E_2$ is excessively small, then it is impossible to remove the defects from the film; that is, it is impossible to improve the uniformity of mobility. The above-described criterions are as indicated in the following Table 2:

TABLE 2

| Energy level | Excessively low level | Excessively high level |
| --- | --- | --- |
| $E_1$ | Nuclei are dissolved by $E_2$ (equal to single anneal) | Poor surface Difficult to melt defects by $E_2$ |
| $E_2$ | Many defects | Cancellation of nuclei (equal to single anneal) |

Hence, in order to make the mobility uniform and satisfactory, it is essential to control the grain size of the crystalline nuclei formed in the amorphous silicon film during irradiation with the beam $E_1$, and to control the energy of irradiation during irradiation with the beam $E_2$.

Through experiments in which the crystalline grain size was controlled by changing various conditions in irradiation with the beam $E_1$, it was found that the grain size in the polycrystal silicon film should be 10 to 1000 Å, preferably 200 Å. The reasons for this are as follows: In the case where crystalline nuclei larger than 1000 Å in grain size are formed by irradiation with the beam $E_1$, the film is lowered in flatness, and the threshold voltage is decreased. In the case where crystalline nuclei smaller than 10 Å are formed, the energy of the beam $E_2$ must be set to a low value in order to maintain the crystalline nuclei. In this case, the defects cannot be sufficiently eliminated by irradiation with the beam $E_2$, so that the resultant thin film transistor is low in characteristic.

FIG. 12 shows the dependence of surface roughness on $E_1$ with $E_2 = 450$ mJ/cm$^2$. The surface roughness of the film was evaluated on an atomic force microscope. In FIG. 12, the threshold energy $E_{TH}$ for melting is 170 mJ/cm$^2$, and the case of $E_1 = 0$ mJ/cm$^2$ corresponds to the conventional single annealing case.

When $E_1$ is low, the roughness is large similarly as in the single annealing case. As $E_1$ increases over $E_{th}$, the roughness decreases. With $E_1 = 270$ mJ/cm$^2$, the roughness is minimum. When this $E_1$ is used for irradiation, the resultant grain size is 200 Å. As $E_1$ is increased, the resultant grain size is also increased; that is, the roughness is increased again. This is because grain size and roughness increase with laser energy. This high energy region cannot be used because of large roughness.

As is seen from FIG. 12, comparison of the grain size provided by irradiation with the beam $E_1$ is as follows:

In the case where $E_1$ is smaller than 270 mJ/cm$^2$, and crystalline nuclei smaller than 200 Å are formed, the roughness and grain size are liable to change. When $E_1$ is close to $E_{th}$, in the irradiation with the beam $E_1$ the resultant grain size is smaller than 10 Å, and therefore the effects of the step annealing operation are not obtained. In the case where $E_1$ is larger than 270 mJ/cm$^2$, crystalline nuclei larger than 200 Å are formed, and the roughness and grain size are liable to increase. Especially when $E_1$ exceeds 400 mJ/cm$^2$ with which crystalline nuclei larger than 1000 Å are formed by irradiation with the beam $E_1$, the roughness exceeds 40 nm, and the threshold voltage is degraded. Thus, it is not acceptable to set the energy $E_1$ to larger than 400 mJ/cm$^2$. Therefore, in the embodiment, with $E_1$ of 270 mJ/cm$^2$, the resultant thin film transistors are highest both in characteristic and in uniformity. In this case, the grain size is 200 Å with irradiation with $E_1$.

Rate-determining parameters for forming a polycrystal silicon layer 10 to 1000 Å in grain size by application of the beam $E_1$ are the intensity of hydrogen in the amorphous silicon film, laser application atmosphere, substrate temperature, excimer laser wavelength, and the intensity of energy of the beam $E_1$. Of those parameters, the intensity of energy of the beam $E_1$ and the substrate temperature are important. As for relationships between these two parameters, the following experiments were performed:

According to the above-described embodiment, the glass substrate on which the amorphous silicon film was formed was taken out. In addition to this, in order to form crystalline silicon nuclei in the amorphous silicon film, a KrF excimer laser beam (oscillation wavelength $\lambda = 248$ nm) was applied to the amorphous silicon film. In this operation, the beam spot of the laser beam was made $7 \times 7$ mm$^2$ with the aid of a beam homogenizer. With the substrate temperature set fixedly to a temperature of 25° C., the irradiation energy of the excimer laser beam was changed, to detect relationships between the irradiation energy and the size of crystalline silicon nuclei. The results of detection are as indicated in FIG. 11. As is apparent from this figure, in order to make the crystalline silicon nuclei range from 10 Å to 1000 Å in grain size at room temperature, it is necessary to set the irradiation energy of the excimer laser beam to 220 to 400 mJ/cm$^2$. Next, with the irradiation energy of the excimer laser beam maintained unchanged, relationships between the temperature of the substrate irradiated with the excimer laser beam and the size of crystalline silicon nuclei were detected. The results of detection are as indicated in FIG. 10. In this case, the irradiation energy of the excimer laser beam was maintained at 270 mJ/cm$^2$ with which most suitable crystalline silicon nuclei 200 Å in grain size can be formed at room temperature. As is apparent from the figure, as the substrate temperature increases, the grain size is increased, and when the substrate temperature exceeds 320° C., the grain size exceeds 1000 Å. Hence, in order to form crystalline silicon nuclei 10 to 1000 Å in grain size in the amorphous silicon film, the irradiation energy of the excimer laser beam should be set in a range of from 220 mJ/cm$^2$ to 400 mJ/cm$^2$, and the substrate temperature should be set in a range of from room temperature to 320° C., preferably to a lower value in the range.

The above-described results are the conditions used in the case where an amorphous silicon film is formed using a SiH$_4$ gas according to the LPCVD method, and a KrF excimer laser 248 nm in oscillation wavelength is employed in the air. In the case where a film forming method different from the LPCVD method, namely, a plasma CVD method, a sputtering method, or a vacuum deposition method is employed, in the case where an XeCl excimer laser (308 nm in oscillation wavelength) or an ArF excimer laser is employed, or in the case where the laser irradiation atmosphere is changed, the irradiation energy and the substrate temperature to obtain polycrystal silicon nuclei 10 to 1000 Å in grain size may be changed. At any rate, the most important thing is to form polycrystal silicon nuclei 10 Å to 1000 Å in grain size by the first energy application.

The irradiation energy $E_1$ must be larger than the threshold energy $E_{TH}$ which is necessary for conversion of amorphous silicon into polycrystal silicon. In order to remove the defects from the polycrystal silicon nuclei in the amorphous silicon film formed by application of the irradiation energy $E_1$, the irradiation energy $E_2$ should be larger than the irradiation energy $E_1$, and smaller than the energy with which the polycrystal silicon nuclei are completely molten.

According to the present invention, the small pitch scanning operation is carried out in such a manner that the beam spot is moved over the amorphous semiconductor layer while being shifted with a pitch of 1 mm or less. Hence, the amorphous semiconductor layer is annealed while a part of the latter to be irradiated with the laser beam next is being heated. Therefore, the polycrystal silicon layer thus formed is less in film stress, and all the parts of the amorphous semiconductor layer thus scanned are substantially equal to one another in the energy applied thereto. The resultant polycrystal semiconductor film is uniform in crystallinity.

According to the present invention, the amorphous semiconductor layer is crystallized by irradiating it with a laser beam of low energy, to form a flat polycrystal semiconductor film, and then it is irradiated with a laser beam of high energy, so that, while the flatness of the polycrystal semiconductor film is being maintained unchanged, the defects are completely molten away therefrom. Thus, the resultant polycrystal semiconductor film is high in flatness, and more uniform in crystallinity.

What is claimed is:

1. A semiconductor element manufacturing method comprising the steps of:
   applying a first laser beam to a semiconductor layer of amorphous material formed on an insulating substrate, to form crystalline nuclei which are in a range of from 10 Å to 1000 Å in grain size, wherein an intensity of energy of said first laser beam is greater than 270 mJ/cm$^2$; and
   applying a second laser beam to said semiconductor layer to remove defects therefrom, wherein an intensity of energy of said second laser beam is greater than said intensity of energy of said first laser beam.

2. A semiconductor element manufacturing method comprising the steps of:
   applying a laser beam to a semiconductor layer of amorphous material formed on an insulating substrate in such a manner that said laser beam forms a beam spot having a width on said semiconductor layer; and
   continuously moving said semiconductor layer and said laser beam relative to each other with a pitch of less than ten percent of said width of said beam spot.

3. A semiconductor element manufacturing method comprising the steps of:
   applying a first laser beam to a semiconductor layer of amorphous material formed on an insulating substrate in such a manner that said laser beam forms a first beam spot having a first width;
   continuously moving said semiconductor layer and said first laser beam relative to each other with a pitch of less than fifty percent of the first width of said first beam spot, to form crystalline nuclei which are in a range of from 10 Å to 1000 Å in grain size;
   applying a second laser beam to said semiconductor layer in such a manner that said second laser beam forms a second beam spot having a second width on said semiconductor layer; and
   continuously moving said semiconductor layer and said second laser beam relative to each other with a pitch of less than fifty percent of the second width of said second beam spot, to remove defects from said semiconductor layer.

4. A semiconductor element manufacturing method as claimed in claim 3, wherein an intensity of energy of said second laser beam is larger than that of said first laser beam.

* * * * *

UNITED STATES PATENT AND TRADEMARK OFFICE
CERTIFICATE OF CORRECTION

PATENT NO. : 5,365,875
DATED : November 22, 1994
INVENTOR(S) : Ichirou ASAI et al It is certified that error appears in the above-indentified patent and that said Letters Patent is hereby corrected as shown below:

Claim 3, Column 12, Line 27 change "fifty" to --ten--.

Claim 3, Column 12, Line 37 change "fifty" to --ten--.

Signed and Sealed this

Sixteenth Day of May, 1995

Attest:

BRUCE LEHMAN

*Attesting Officer*     *Commissioner of Patents and Trademarks*